(12) United States Patent
Gu et al.

(10) Patent No.: US 10,971,476 B2
(45) Date of Patent: Apr. 6, 2021

(54) BOTTOM PACKAGE WITH METAL POST INTERCONNECTIONS

(71) Applicant: QUALCOMM Incorporated, San Diego, CA (US)

(72) Inventors: Shiqun Gu, San Diego, CA (US); Ratibor Radojcic, San Diego, CA (US); Dong Wook Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 268 days.

(21) Appl. No.: 14/254,494

(22) Filed: Apr. 16, 2014

(65) Prior Publication Data
US 2015/0235991 A1 Aug. 20, 2015

Related U.S. Application Data

(60) Provisional application No. 61/941,345, filed on Feb. 18, 2014.

(51) Int. Cl.
*H01L 23/48* (2006.01)
*H01L 25/065* (2006.01)
(Continued)

(52) U.S. Cl.
CPC ........ *H01L 25/0655* (2013.01); *H01L 21/486* (2013.01); *H01L 21/4853* (2013.01);
(Continued)

(58) Field of Classification Search
CPC ........... H01L 23/49833; H01L 25/0655; H01L 23/5389; H01L 24/97; H01L 25/105; H01L 24/17; H01L 23/3157; H01L 23/5226; H01L 24/02; H01L 23/49816; H01L 23/5384; H01L 23/147; H01L 23/49811; H01L 23/15; H01L 23/145;
(Continued)

(56) References Cited

U.S. PATENT DOCUMENTS 6,812,066 B2 11/2004 Taniguchi et al.
7,892,889 B2 2/2011 Howard et al.
(Continued)

FOREIGN PATENT DOCUMENTS

CN 1499590 A 5/2004
CN 101159261 A 4/2008
(Continued)

OTHER PUBLICATIONS

Ho, S.W., et al., "Double Side Redistribution Layer Process on Embedded Wafer Level Package for Package on Package (PoP) Applications," 2010 12th Electronics Packaging Technology Conference (EPTC), 2010, pp. 383-387.
(Continued)

*Primary Examiner* — Shouxiang Hu
(74) *Attorney, Agent, or Firm* — Michelle S. Gallardo; Qualcomm Incorporated (57) ABSTRACT

A bottom package substrate is provided that includes a plurality of metal posts that electrically couple through a die-side redistribution layer to a plurality of die interconnects. The metal posts and the die interconnects are plated onto a seed layer on the bottom package substrate.

14 Claims, 10 Drawing Sheets

(51) Int. Cl.
| | |
|---|---|
| *H01L 23/31* | (2006.01) |
| *H01L 23/522* | (2006.01) |
| *H01L 23/00* | (2006.01) |
| *H05K 1/09* | (2006.01) |
| *H05K 1/11* | (2006.01) |
| *H01L 23/498* | (2006.01) |
| *H01L 25/10* | (2006.01) |
| *H01L 21/48* | (2006.01) |
| *H01L 23/538* | (2006.01) |
| *H01L 23/15* | (2006.01) |
| *H01L 23/14* | (2006.01) |

(52) U.S. Cl.
CPC .... *H01L 23/3157* (2013.01); *H01L 23/49811* (2013.01); *H01L 23/5226* (2013.01); *H01L 23/5389* (2013.01); *H01L 24/02* (2013.01); *H01L 24/17* (2013.01); *H01L 24/97* (2013.01); *H01L 25/105* (2013.01); *H05K 1/09* (2013.01); *H05K 1/115* (2013.01); *H01L 23/145* (2013.01); *H01L 23/147* (2013.01); *H01L 23/15* (2013.01); *H01L 23/49816* (2013.01); *H01L 23/5384* (2013.01); *H01L 2224/02372* (2013.01); *H01L 2224/02373* (2013.01); *H01L 2224/0401* (2013.01); *H01L 2224/131* (2013.01); *H01L 2224/16238* (2013.01); *H01L 2224/1712* (2013.01); *H01L 2224/81447* (2013.01); *H01L 2224/81455* (2013.01); *H01L 2224/97* (2013.01); *H01L 2225/1023* (2013.01); *H01L 2225/1058* (2013.01); *H01L 2924/01028* (2013.01); *H01L 2924/01029* (2013.01); *H01L 2924/12042* (2013.01); *H01L 2924/157* (2013.01); *H01L 2924/1533* (2013.01); *H01L 2924/1579* (2013.01); *H01L 2924/15192* (2013.01); *H01L 2924/15311* (2013.01); *H01L 2924/15788* (2013.01); *H01L 2924/181* (2013.01); *H01L 2924/18161* (2013.01); *H05K 2201/09845* (2013.01); *H05K 2201/10242* (2013.01)

(58) Field of Classification Search
CPC ........... H01L 23/3128; H01L 23/49827; H01L 23/481; H01L 23/48; H01L 23/585; H01L 24/24

USPC ....... 257/686, 737, 774, 777, 738, 778, 723, 257/773, 690, 784, 762, 783, 787
See application file for complete search history.

(56) References Cited

U.S. PATENT DOCUMENTS

| | | | |
|---|---|---|---|
| 8,169,073 B2* | 5/2012 | Murayama | H01L 21/4853 257/723 |
| 8,587,129 B2 | 11/2013 | Chi et al. | |
| 2008/0136004 A1* | 6/2008 | Yang | H01L 24/96 257/686 |
| 2008/0230921 A1* | 9/2008 | Yamano | H01L 23/3107 257/777 |
| 2011/0114377 A1 | 5/2011 | Brun | |
| 2011/0147908 A1 | 6/2011 | Sun et al. | |
| 2012/0015481 A1 | 1/2012 | Kim | |
| 2012/0080787 A1 | 4/2012 | Shah et al. | |
| 2012/0112361 A1* | 5/2012 | Han | H01L 23/49833 257/774 |
| 2012/0119373 A1* | 5/2012 | Hunt | H01L 21/565 257/774 |
| 2013/0187268 A1 | 7/2013 | Lin et al. | |
| 2013/0256875 A1 | 10/2013 | Chen et al. | |
| 2014/0015121 A1 | 1/2014 | Koizumi et al. | |
| 2014/0077394 A1* | 3/2014 | Chang | H01L 23/4334 257/782 |
| 2015/0145142 A1* | 5/2015 | Lin | H01L 21/561 257/774 |

FOREIGN PATENT DOCUMENTS

| | | |
|---|---|---|
| CN | 103208487 A | 7/2013 |
| EP | 1418617 A2 | 5/2004 |
| EP | 1744362 A2 | 1/2007 |
| EP | 1909323 A2 | 4/2008 |
| JP | 2005166909 A | 6/2005 |
| JP | 2012079734 A | 4/2012 |
| WO | WO-2009147148 A1 | 12/2009 |

OTHER PUBLICATIONS

International Search Report and Written Opinion—PCT/US2015/014870—ISA/EPO—dated Jul. 15, 2015.

* cited by examiner

BOTTOM PACKAGE WITH METAL POST INTERCONNECTIONS

CROSS-REFERENCE TO RELATED APPLICATIONS

This application claims the benefit of U.S. Provisional Application No. 61/941,345, filed Feb. 18, 2014, the contents of which are hereby incorporated by reference in their entirety.

TECHNICAL FIELD

This application relates to integrated circuit packaging, and more particularly to a bottom package having metal post interconnections.

BACKGROUND

Organic substrates are commonly used in package-on-package architectures because of their low cost. For example, a flip-chip die such as a micro-processor may be coupled to a first surface of an organic substrate for a bottom package through a plurality of solder bumps or copper pillars. To support a coupling or interconnection to a top package substrate, the bottom package substrate has a footprint large enough such that there is perimeter about the bottom package die on the first surface of the bottom package substrate. That perimeter may then support solder ball interconnections to the top package. Although the resulting package-on-package architecture is quite popular due to its low cost, organic substrates are often not suitable for modern fine-pitch dies because an organic substrate accommodates only a relatively coarse interconnect pitch. The interconnect pitch is the separation between the substrate-to-die interconnections such as micro-bumps or copper pillars as well as the bottom-package-to-top-package interconnections such as solder balls.

Because of the interconnect pitch limitations for organic substrates, the bottom package substrate for modern fine-pitch dies typically comprises a glass or semiconductor interposer. In contrast to an organic substrate, a glass or semiconductor interposer supports fine-pitch interconnections. It is thus conventional to mount fine-pitch dies onto an interposer because a glass or silicon interposer enables the necessary fine-pitch interconnections. Multiple fine-pitch dies such as a first processor die and a second processor die may be mounted on the same interposer. The interposer receives the fine-pitch interconnects such as micro-bumps or copper pillars from each die through a redistribution layer (RDL) that enables each die to communicate with the other die(s) through the RDL. Although the resulting interposer package is thus advantageous in that it accommodates the necessary fine-pitch interconnections, it is conventional to interface processors with associated external memories such as a DRAM die using a package-on-package (PoP) construction. But the footprint of the interposer is already somewhat large as it must have the necessary surface area to support the fine-pitch dies.

If such an interposer also includes a perimeter around the fine-pitch dies to provide space for conventional PoP solder ball interconnections to an upper memory package substrate, the interposer footprint becomes excessive. For example, it is conventional to encase the dies on the interposer and the solder ball interconnections with mold compound during manufacture of the bottom package. The encased solder balls must then be exposed such as through the use of laser drilling of the mold compound. The heat from the laser requires a certain keep-out distance between the solder balls and the dies. The resulting interposer for the bottom package thus requires a relatively large footprint to support not only the dies and the solder balls but also the keep out distance between the solder balls and the dies. In addition, the solder balls must be relatively large to couple to the upper package. Such a relatively large interconnect size requires a correspondingly large interconnect pitch. The interposer footprint thus must be large enough to support both the solder balls with their requisite pitch as well as the associated keep-out area between the solder balls and the die, which decreases density and is expensive. As an alternative, the interposer may include a perimeter that supports an interconnect bar such as a printed circuit bar or a silicon or glass interconnect bar. The interconnect bar includes a number of plated vias as opposed to solder balls. But the manufacture of the plated vias in the interconnect bar also require a certain distance or keep out area with regard to the interconnect bar outer perimeter. Thus, regardless of whether a conventional interposer includes solder balls or interconnect bars, the interposer footprint must be relatively large.

Accordingly, there is a need in the art for bottom package substrates such as interposers with reduced footprints.

SUMMARY

A bottom package is provided with plated metal posts for forming interconnects to a top package. The plated metal posts enable a reduced footprint for the bottom package as compared to conventional bottom packages that use solder balls or interconnect bars to form the interconnections to an upper package or additional die. The bottom package includes a bottom package substrate supporting one or more dies. In some embodiments, the bottom package substrate may comprise a glass, silicon, or laminated organic interposer that supports a plurality of dies. In alternative embodiments, the bottom package substrate may comprise a glass substrate, a semiconductor substrate, or a laminated organic substrate that supports a single die.

To provide the reduced footprint, the bottom package substrate includes a plurality of plated metal posts coupled to die interconnects through a redistribution layer (RDL). The die(s) supported by the bottom package substrate couple through the die interconnects to the RDL, from the RDL to the metal posts, and from the metal posts to a top package substrate. In contrast to conventional bar interconnect embodiments, both the metal posts and the die interconnects are plated onto a seed layer overlaying the RDL. The die interconnects and metal posts may be plated onto the seed layer prior to attachment of the die (or dies) to the bottom package substrate. The metal posts may thus be deposited without any need for a keep out area in contrast to conventional bar interconnect or solder ball embodiments. The resulting bottom package substrates disclosed herein thus have advantageously enhanced density as compared to conventional architectures.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

To avoid the excessive footprint demands from the conventional use of solder balls or bar interconnects to electrically couple a bottom package to a top package, a bottom package is provided with plated metal posts for forming the interconnects to the top package. The plated metal posts enable a reduced footprint for the bottom package as compared to the conventional bottom packages that use solder balls or interconnect bars to form the interconnections to an upper package or additional die. The bottom package includes a bottom package substrate supporting one or more dies. In some embodiments, the bottom package substrate may comprise a glass, silicon, or laminated organic interposer that supports a plurality of dies. In alternative embodiments, the bottom package substrate may comprise a glass, semiconductor, or laminated organic substrate that supports a single die.

Since the metal posts disclosed herein are plated on the bottom package substrate, manufacturing costs are considerably reduced as compared to the conventional use of interconnect bars, which requires the extra process steps of embedding the interconnect bar in the bottom package substrate. Moreover, the interconnect bar manufacture typically requires laser drilling of the vias that are then plated to form the metal posts in the interconnect bar. The interconnect bar thus requires a relatively large keep out area around its entire perimeter. In contrast, the plating of the metal posts for the bottom package disclosed herein requires no laser drilling. The plated metal posts thus require a reduced keep out area as compared to the use of interconnect bars not only with respect to the die(s) but also with respect to the perimeter of the bottom package substrate. Accordingly, the disclosed bottom package offers increased density and reduced manufacturing costs.

To provide a reduced footprint and to increase density, the plated metal posts electrically couple to die interconnects through a redistribution layer (RDL) in the bottom package. In one embodiment, the die interconnects comprise metal pillars. In that regard, a conventional interposer may also have a redistribution layer that electrically couples die interconnects such as metal pillars to metal posts in a bar interconnect. But a conventional bar interconnect is manufactured separately from the bottom package substrate. In this conventional manufacturing process, the substrate forming the bar interconnect is drilled such as through laser or mechanical drilling to form a plurality of vias that are subsequently plated to complete the bar interconnect posts. Due to the drilling or machining process to form the vias in the bar interconnect substrate, the vias (and thus the metal posts that will eventually fill the vias) must be spaced a certain keep out distance from the bar interconnect substrate perimeter. As discussed earlier, the resulting keep out distance in bar-interconnect-containing bottom package substrates limits density and thus increases costs.

In sharp contrast, the metal posts disclosed herein are not manufactured separately in a bar interconnect. Instead, the disclosed metal posts are manufactured in situ on the bottom package substrate. To enable this in situ formation, a seed layer covers the redistribution layer. A dielectric layer then covers the seed layer. Windows are opened up in the dielectric layer to form die interconnect openings and also metal post openings. Metal may then be plated onto the seed layer portions exposed in the die interconnect openings and the metal post openings to form the die interconnects and the metal posts.

Since it is the same seed layer that is exposed in the die interconnect openings as is exposed in the metal post openings, this seed layer is also denoted herein as a single seed layer. The die interconnects and metal posts may be deposited onto the seed layer prior to attachment of the die (or dies) to the bottom package substrate. As compared to the use of an interconnect bar, the metal posts may thus be formed without a reduced keep out area both with respect to the edge of the substrate and with respect to the dies(s). In contrast, an interconnect bar is diced from a wafer of such bars and thus requires a larger keep out area. The resulting bottom package substrates disclosed herein thus have advantageously enhanced density and lower fabrication cost as compared to conventional architectures. These advantageous features may be better appreciated with regard to the following example embodiments.

Example Embodiments

Figure 1A:
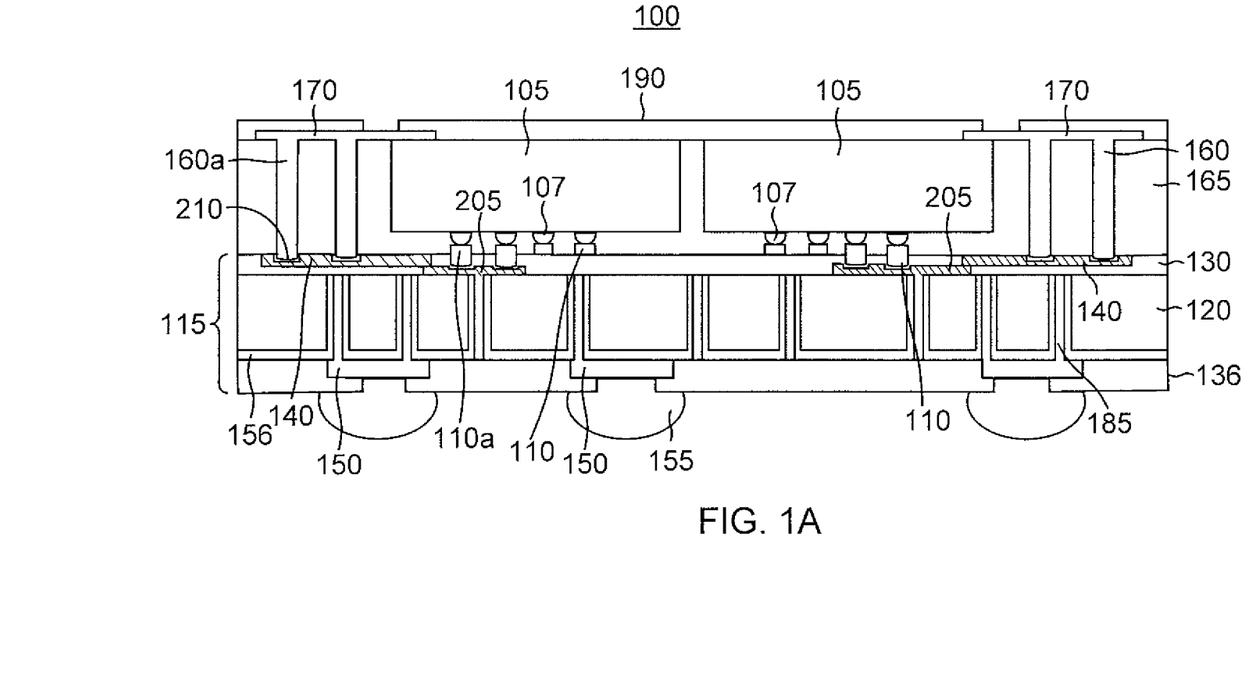
FIG. 1A is a cross-sectional view of a bottom package including metal posts in accordance with an embodiment of the disclosure.

Turning now to the drawings, FIG. 1A illustrates a metal-post-enhanced bottom package 100 including a semiconductor or glass interposer 115. Alternatively, interposer 115 may comprise a laminated organic interposer. In alternative embodiments, interposer 115 may instead comprise a substrate that supports only a single die 105. Analogous to the interposer embodiments, the substrate for bottom package single-die embodiments may comprise glass, semiconductor, or laminated organic polymers.

Each die 105 electrically couples through a plurality of interconnects such as solder bumps 107 to a corresponding plurality of die interconnects 110 on substrate 115. Die interconnects 110 also electrically couple to a die-side redistribution layer that in turn electrically couples to a plurality of metal posts 160. In bottom package 100, the die-side redistribution layer comprises an upper or first die-side RDL 140 and a lower or second die-side RDL 205. Alternative embodiments may have just a single metal layer for the die-side redistribution layer or may have more than two metal layers. In bottom package 100, interconnects 110 electrically couple to lower die-side RDL 205. In turn, lower die-side RDL 205 electrically couples to upper die-side RDL 140, which then electrically couples to metal posts 160. In one embodiment, die interconnects 110 may be deemed to comprise a means for electrically coupling dies 105 to a die-side redistribution layer such as lower die-side RDL, 205. Die interconnects 110 and metal posts 160 may comprise any suitable plated metal such as copper or nickel. Similarly, the various redistribution layers disclosed herein such as upper and lower die-side redistribution layers 140 and 205 may comprise copper, nickel, or other conducting metals. Upper and lower die-side redistribution layers 140 and 205 form conductors or interconnects within a dielectric layer 130 to electrically couple die interconnects 110 to corresponding ones of metal posts 160. For example, a particular die interconnect 110 such as a die interconnect 110a may need to electrically couple to a particular metal post 160 such as a metal post 160a. Upper die-side RDL 140 and lower die-side RDL 205 thus electrically couple together these structures. In addition, upper and lower die-side RDLs 140 and 205 include conductors (not illustrated) to electrically couple die-to-die signals between dies 105. Similarly, lower die-side RDL 205 electrically couple dies 105 to a plurality of through-substrate vias 185.

Through-substrate vias 185 extend from lower die-side RDL 205 through a core layer 120 of substrate 115 to a board-facing redistribution layer (RDL) 150 that in turn electrically couples to board-facing solder balls 155. The composition of core layer 120 depends upon the substrate used in bottom package 100. For example, in a glass interposer embodiment, core layer 120 would comprise glass. Similarly, in a semiconductor interposer embodiment, core layer 120 would comprise semiconductor. Board-facing redistribution layer 150 may be insulated from core layer 120 by a dielectric layer 156. For example, dielectric layer 156 may be laminated onto core layer 120 to also line through-substrate vias 185. A board-side solder resist or passivation layer 136 includes openings so that exposed pad portions of board-facing redistribution layer 150 may receive solder balls 155. Solder balls 155 electrically couple to a circuit board (not illustrated) or an underlying package.

Figure 1B:
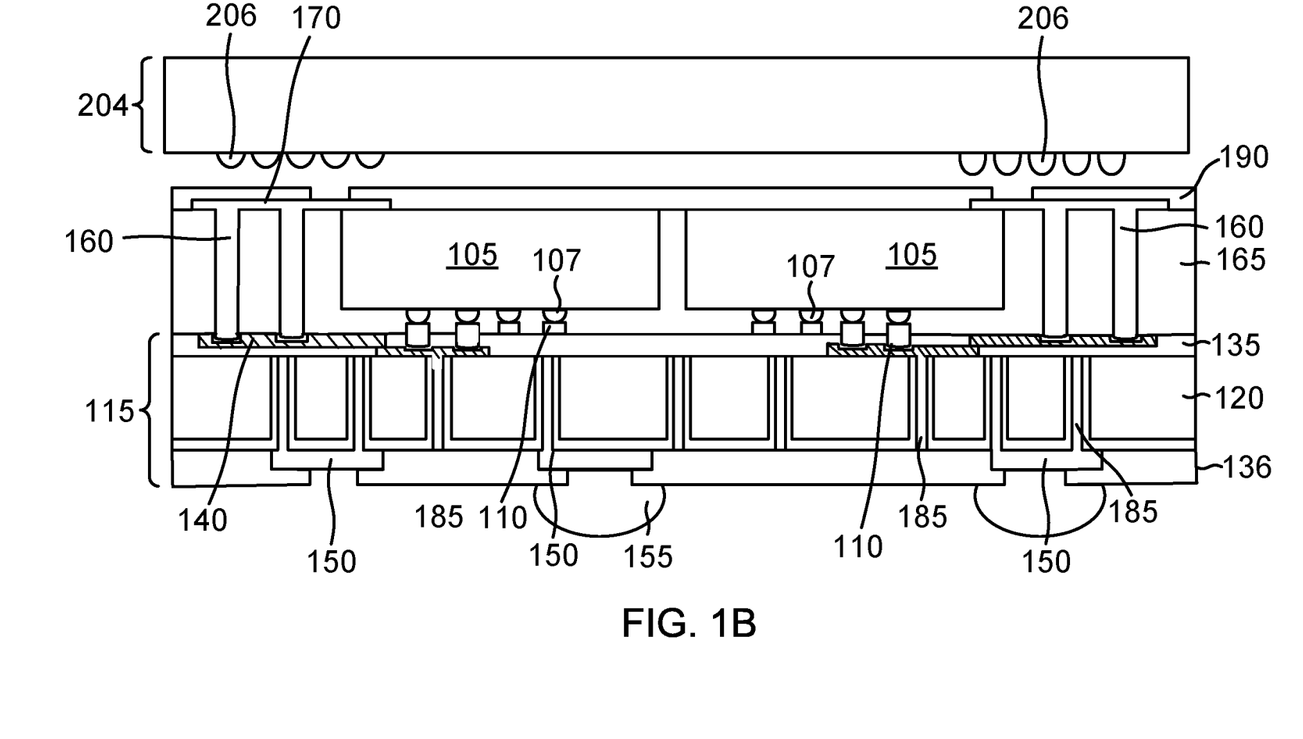
FIG. 1B is a cross-sectional view of the bottom package of FIG. 1A as it receives a top package to form a package-on-package (PoP) construction.

A mold compound 165 partially encases dies 105 and metal posts 160. Metal posts 160 may also electrically couple to a top-side redistribution layer 170 on mold compound 165 and dies 105. A top-side solder resistor or passivation layer 190 covers top-side redistribution layer 170. In alternative embodiments, top-side redistribution layer 170 may be insulated from dies 105 by passivation layer 190, which includes openings to expose pads in top-side redistribution layer 170. These openings may receive interconnects 206 such as solder bumps or copper pillars from a top package 204 as shown in FIG. 1B. Upper package 204 is shown in FIG. 1B just prior to it being mounted onto bottom package 100. Thus bumps 206 do not yet make contact to top-side redistribution layer 170 in FIG. 1B. Top-side redistribution layer 170 allows for a fan-out between pillars 160 and interconnects 206 from top package 204. An example manufacturing method will now be discussed.

Example Method of Manufacture

Manufacture of bottom package 100 shown in FIGS. 1A and 1B may be performed in wafer-level process (WLP) embodiments or individually. In a WLP embodiment, interposer core 120 would initially be part of a wafer or panel (not illustrated) that would be processed as a whole. The panel or wafer would include a plurality of interposer cores 120 that are processed with die interconnects 110 and metal posts 160 prior to dicing interposer cores 120 from the panel or wafer. Alternatively, each interposer core 120 may be processed individually after it is diced from a panel or wafer.

Figure 2A:
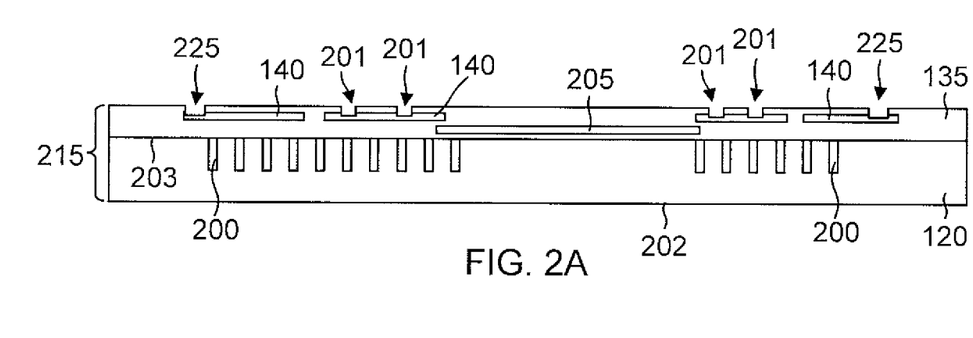
FIG. 2A is a cross-sectional view of an interposer used to form the bottom package of FIG. 1A prior to deposition of die interconnects and the metal posts.

Interposer core 120 may be configured with through-substrate vias 185 in a variety of methods. For example, interposer core 120 may be laser drilled and plated to form vias 185. Alternatively, a number of blind vias may be for formed using, for example, laser drilling or machining and then plated in interposer core 120 prior to a grinding step that exposes the blind ends of the blind vias and thus forms through-substrate vias 185. For example, FIG. 2A illustrates a cross-section of an interposer core 120 including a plurality of conductive blind vias 200. In this embodiment, interposer core 120 is part of a wafer or panel 215 such that a WLP manufacturing technique is being implemented. To form conductive blind vias 200, a die-facing surface of interposer core 120 is laser drilled, etched, or mechanically drilled to form a plurality of blind vias that are then plated to form conductive blind vias 200. Prior to plating, the blind vias may be lined with a dielectric layer (not illustrated) such as dielectric layer 156 shown in FIG. 1A.

Figure 2B:
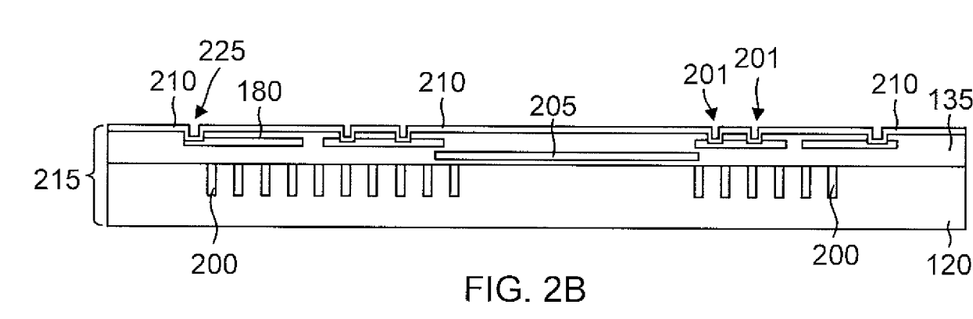
FIG. 2B is a cross-sectional view of the interposer of FIG. 2A after deposition of the seed layer.

As shown in FIG. 2A, a board-facing surface 202 of interposer core 120 has not yet been ground to expose the ends of conductive e blind vias 200 so as to form through-substrate vias 185 discussed with regard to FIGS. 1A and 1B. Since FIG. 2A is illustrating an initial manufacture step, through-substrate vias 185 shown in FIGS. 1A and 1B are not yet formed. After formation of conductive blind vias 200, a dielectric layer 135 is deposited on a die-facing surface 203 of interposer core 120 supports dielectric layer 135. For example, dielectric layer 135 may be laminated onto die-facing surface 203. In such embodiments, dielectric layer 135 may comprise polymide, Ajinomoto build-up film, benzocyclobutene-based polymer, or other suitable dielectric materials. Alternatively, dielectric layer 135 may be spun onto die-facing surface 203 or deposited using chemical vapor deposition techniques. Dielectric layer 135 may be deposited in stages to allow for masking steps so a die-side redistribution layer such as upper die-side redistribution layer 140 may be formed within dielectric layer 135. For example, a metal such as copper or nickel may be deposited using plating or electroless techniques to form upper die-side RDL140. As discussed above, multiple metal layers may be used in the various redistribution layers disclosed herein. Thus dielectric layer 135 may include an additional die-side redistribution layer such as lower die-side RDL 205 formed analogously as discussed with regard to upper die-side RDL 140. In some embodiments, interposer core 120 may comprise a semiconductor such as silicon that has some conductivity. To prevent shorting to such conductive substrates, lower die-side RDL 205 may be insulated from interposer core 120 by dielectric layer 135 as shown in FIG. 2B. Alternatively, if interposer core 120 comprises a glass or organic material, lower die-side RDL 205 may contact interposer core 120 as shown in FIG. 1A.

After its deposition, dielectric layer 135 may be processed such as through etching to form openings for the subsequent formation of metal posts 160 and die interconnects 110 discussed with regard to FIGS. 1A and 1B. For example, dielectric layer 135 may be patterned to include die interconnect openings 201 that expose corresponding portions of lower die-side RDL 205. Similarly, dielectric layer 135 may be patterned to include metal post openings 225 that also expose corresponding portions of upper die-side RDL 140.

After the formation of die interconnect openings 201 and metal post openings 225, dielectric layer 135 may then be covered with a metal seed layer 210 to as shown in FIG. 2B. For example, metal seed layer 210 may comprise TiCu, TiW, or copper deposited using, for example, a physical vapor technique. Note that single seed layer 210 lines both die interconnect openings 201 and metal post openings 225.

Figure 2C:
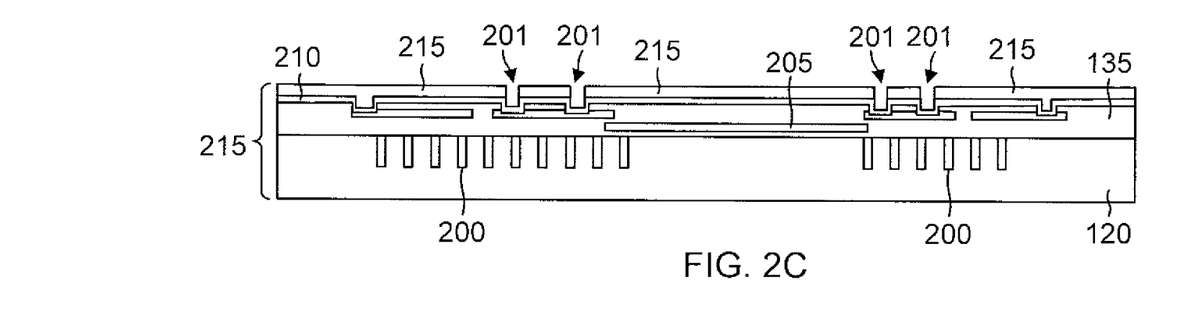
FIG. 2C is a cross-sectional view of the interposer of FIG. 2B after deposition and patterning of a first mask layer for forming the die interconnects.

As shown in FIG. 2C, a first mask layer 215 such as a wet or dry etch mask layer may then be deposited over seed layer 210 and patterned to re-expose die interconnect openings 201. In some embodiments, the re-expose may enlarge die interconnect openings 201 as compared to their dimensions in FIG. 2A. First mask layer 215 is thus deposited in a thickness that matches a desired height for the die interconnects (not yet formed) that will fill die interconnect openings 201. In this fashion, die interconnects 110 may then be plated into die interconnect openings 201 as shown in FIG. 2O. For example, a suitable metal such a copper or nickel may be electroplated to form die interconnects 110. First mask layer 215 of FIG. 2C may then be stripped or removed from panel or wafer 215 at this time.

Figure 2D:
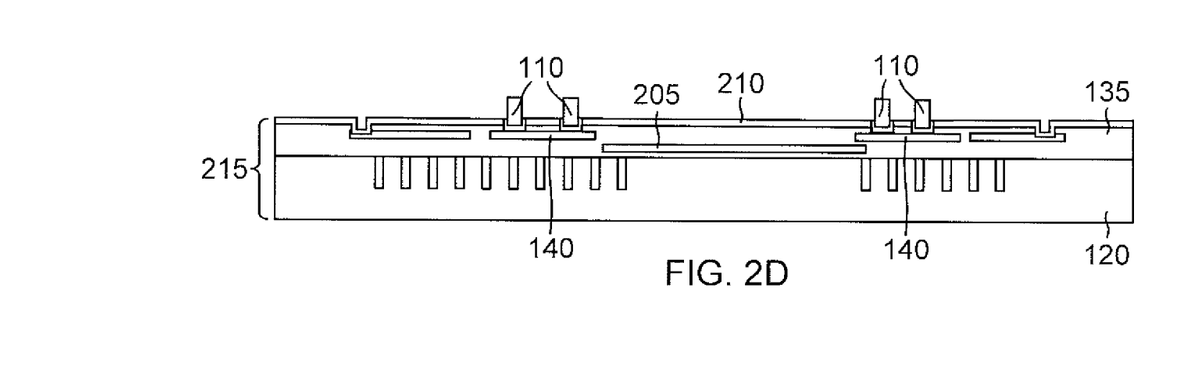
FIG. 2D is a cross-sectional view of the interposer of FIG. 2C after deposition of the die interconnects and removal of the first mask layer.
Figure 2E:
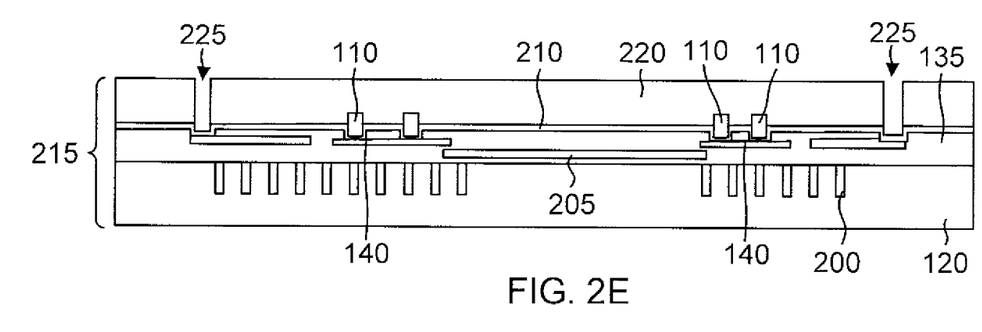
FIG. 2E is a cross-section view of the interposer of FIG. 2D after deposition and patterning of a second mask layer for forming the metal posts.

Metal posts 160 of FIGS. 1A and 1B have a greater height or length as compared to die interconnects 110. Thus, in some embodiments metal posts 160 are not plated at the time of plating die interconnects 110 since first mask layer 215 has a height to match a desired height for die interconnects 110 and not for metal posts 160. The formation of metal posts 160 may then begin with a deposition of a second mask layer 220 over seed layer 210 as shown in FIG. 2E. As compared to first mask layer 215 (FIG. 2C), second mask layer 220 has a greater thickness or height so as to accommodate the greater height of metal posts 160 as compared to die interconnects 110. Analogous to first mask layer 215, second mask layer 220 is patterned to re-expose and enlarge metal post openings 225.

Figure 2F:
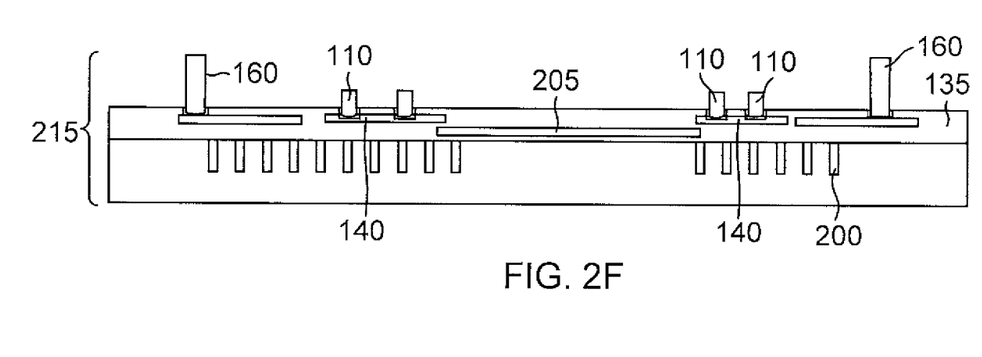
FIG. 2F is a cross-section view of the interposer of FIG. 2E after deposition of the metal posts and removal of the second mask layer.

Metal posts 160 may then be plated into metal post openings 225 and second mask layer 220 stripped or otherwise removed as shown in FIG. 2F. Similarly, the exposed portions of seed layer 210 are also etched away at this time. However, there will remain those portions of seed layer 210 (not illustrated) onto which die interconnects 110 and metal posts 160 were plated. The etching of seed layer 210 may produce the same amount of undercut (not illustrated) on those portions remaining under die interconnects 110 and metal posts 160.

Figure 2G:
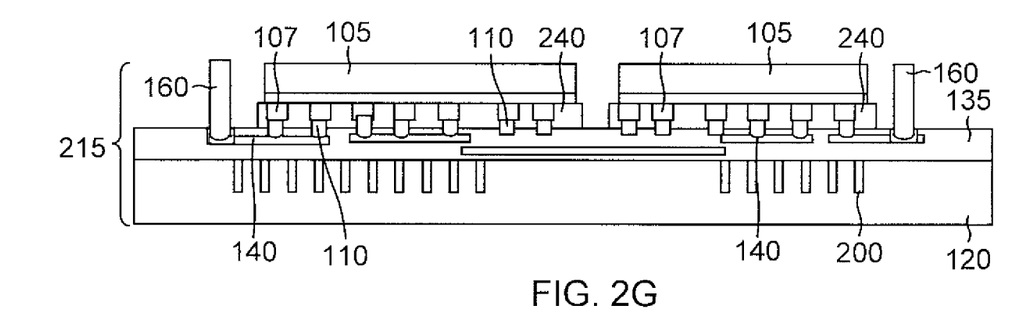
FIG. 2G is a cross-sectional view of the interposer of FIG. 2F after attachment of a pair of dies.

The attachment of dies 105 is illustrated in FIG. 2G. Interconnects on dies 105 such as solder bumps 107 or copper pillars electrically couple to corresponding die interconnects 110 on panel or wafer 215. An underfill 240 may also be applied at this time to assist in securing dies 105 to panel or wafer 215.

Figure 2H:
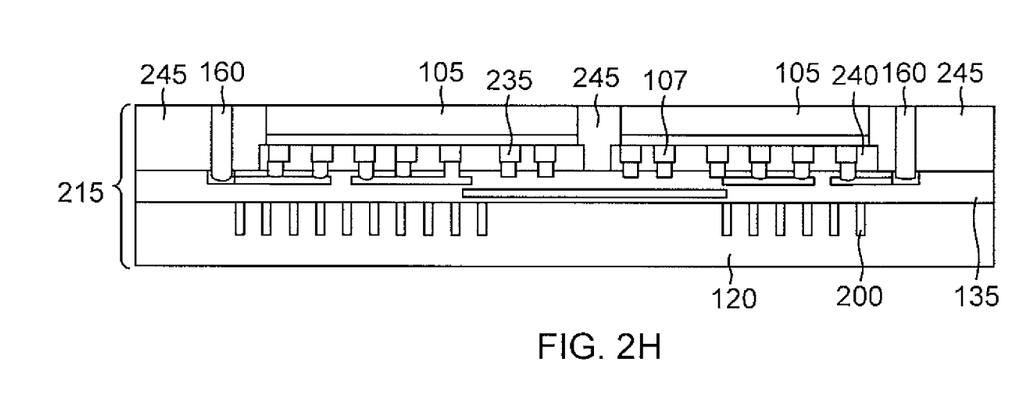
FIG. 2H is a cross-sectional view of the interposer of FIG. 2G after deposition of mold compound to encase the dies and after attachment of solder balls.

After dies 105 have been attached, a mold compound 245 may then be applied to at least partially encapsulate dies 105 as shown in FIG. 2H. Mold compound also partially encapsulates metal posts 160. An upper surface for both metal posts and dies 105 may be left exposed after application of mold compound 245. Alternatively, a grinding process may be used to expose metal posts 160.

Figure 2I:
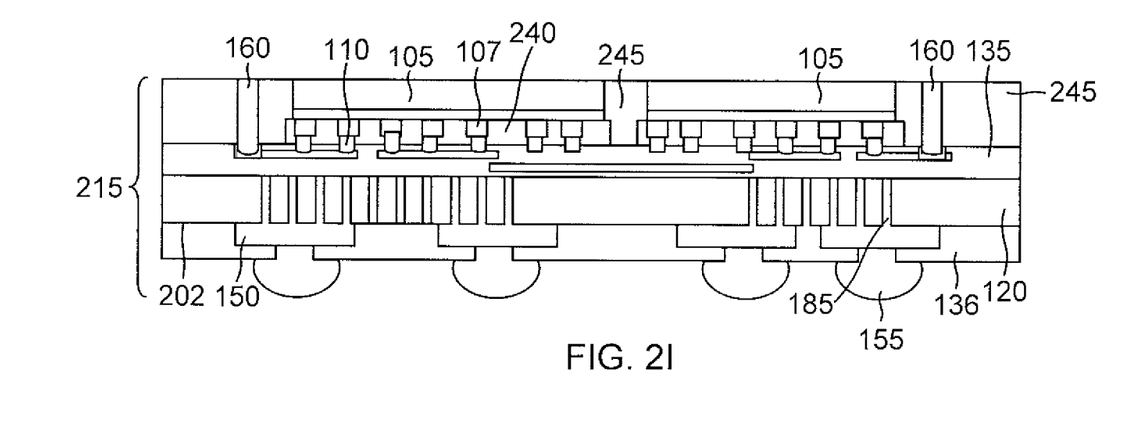
FIG. 2I is a cross-sectional view of the interposer of FIG. 2H after back-side grinding and formation of a board-facing redistribution layer and solder balls.

Through-substrate vias 185 may then exposed on the bottom or board-facing surface of interposer core 120. For example, a manufacturer may grind board-facing side 202 of wafer or panel 215 to expose what had been the blind ends of conductive blind vias 200 (shown, for example in FIG. 2H) to form through substrate-vias 185. A board-facing redistribution layer 150 may then be deposited on board-facing surface 202 along with a solder resist or passivation layer 136 that is patterned for form openings for solder balls 155 as shown in FIG. 2I.

Figure 2J:
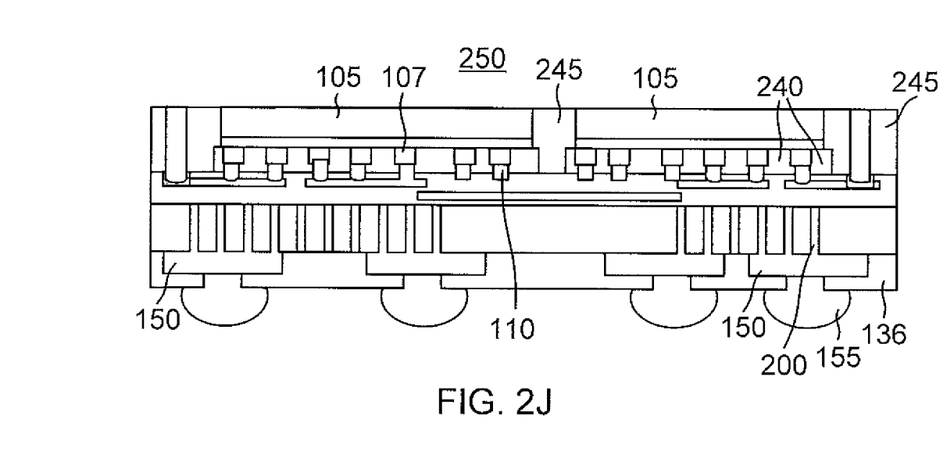
FIG. 2J is a cross-sectional view of the interposer of FIG. 2I after dicing to complete construction of the bottom package.

Since the manufacturing steps discussed above with regard to FIGS. 2A through 2I were directed to a WLP embodiment, these steps may all be performed on intact wafer or panel 215. Dicing from panel 215 thus provides a completed bottom package 250 as shown in FIG. 2J.

Figure 3:
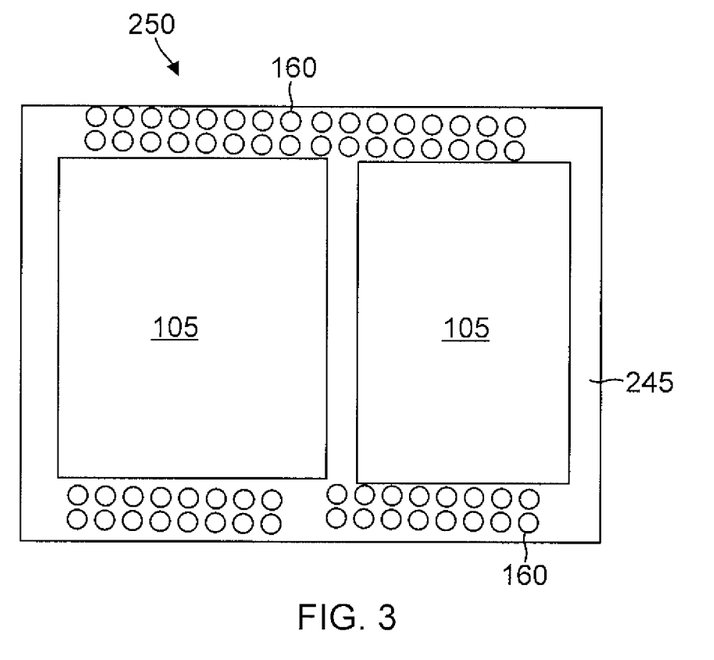
FIG. 3 is a plan view of the bottom package of FIG. 2J showing the arrangement of the metal posts with respect to the dies.

To provide a better appreciation of the density advantages for bottom package 250, its die-facing surface is shown in plan view in FIG. 3. Metal posts 160 are arranged on a periphery of bottom package 250 with regard to dies 105. Mold compound 245 fills the spaces between metal posts 160 and dies 105. But such an arrangement need not include the keep-out area between metal posts 160 and dies 105 as in conventional interconnect bar packages. As discussed previously, the manufacture of an interconnect bar requires a certain keep-out area with regard to its perimeter in that the interconnect bar substrate is typically laser drilled to form vias for the subsequent plating of metal posts. Such drilling cannot be performed too closely to the interconnect bar substrate perimeter. In sharp contrast, metal posts 160 are deposited on the same seed layer 210 on which die interconnects 110 are deposited as discussed with regard to, for example, FIG. 2F. Density becomes even worse for conventional bottom packages that use solder balls for the interconnects to the top package. Thus, bottom package 250 has advantageously increased density as compared to conventional approaches. A flowchart summarizing the manufacturing process will now be discussed.

Example Method of Manufacture Summary

Figure 4:
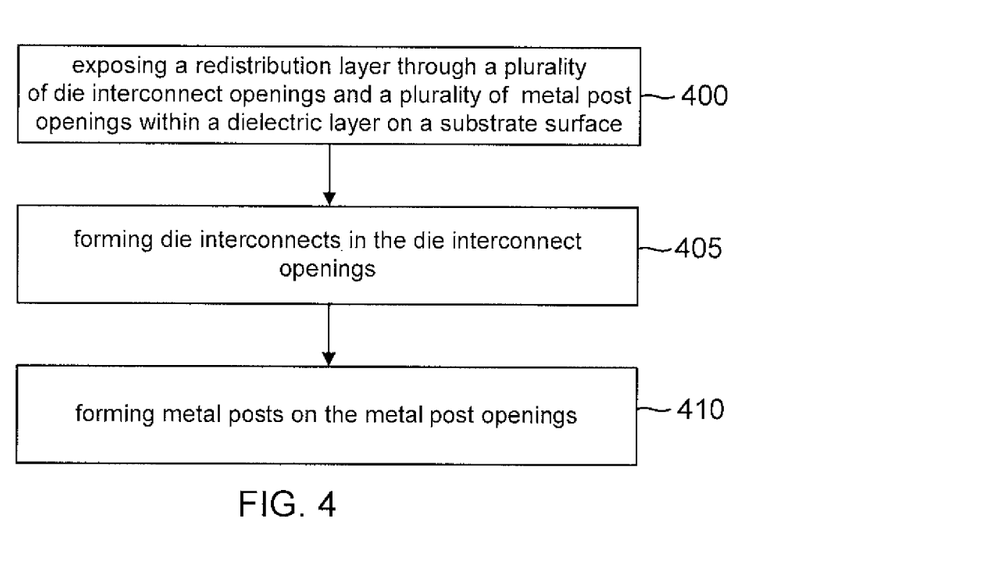
FIG. 4 is a flowchart summarizing a method of manufacture for a bottom package in accordance with an embodiment of the disclosure.

The method of manufacture may be summarized as shown in the flowchart of FIG. 4. A step 400 comprises exposing a redistribution layer through a plurality of die interconnect openings and a plurality of metal post openings within a dielectric layer on a substrate surface. The formation of die interconnect openings 201 shown in FIG. 4C as well as the formation of metal post openings 235 shown in FIG. 2E are examples of step 400. A step 405 comprises forming die interconnects in the die interconnect openings. The formation of die interconnects 110 shown in FIG. 2D provides an example of step 405. Finally, a step 410 comprises forming metal posts in the metal post openings. The formation of metal posts 160 shown in FIG. 2F provides an example of step 410.

Example Electronic Systems

Figure 5:
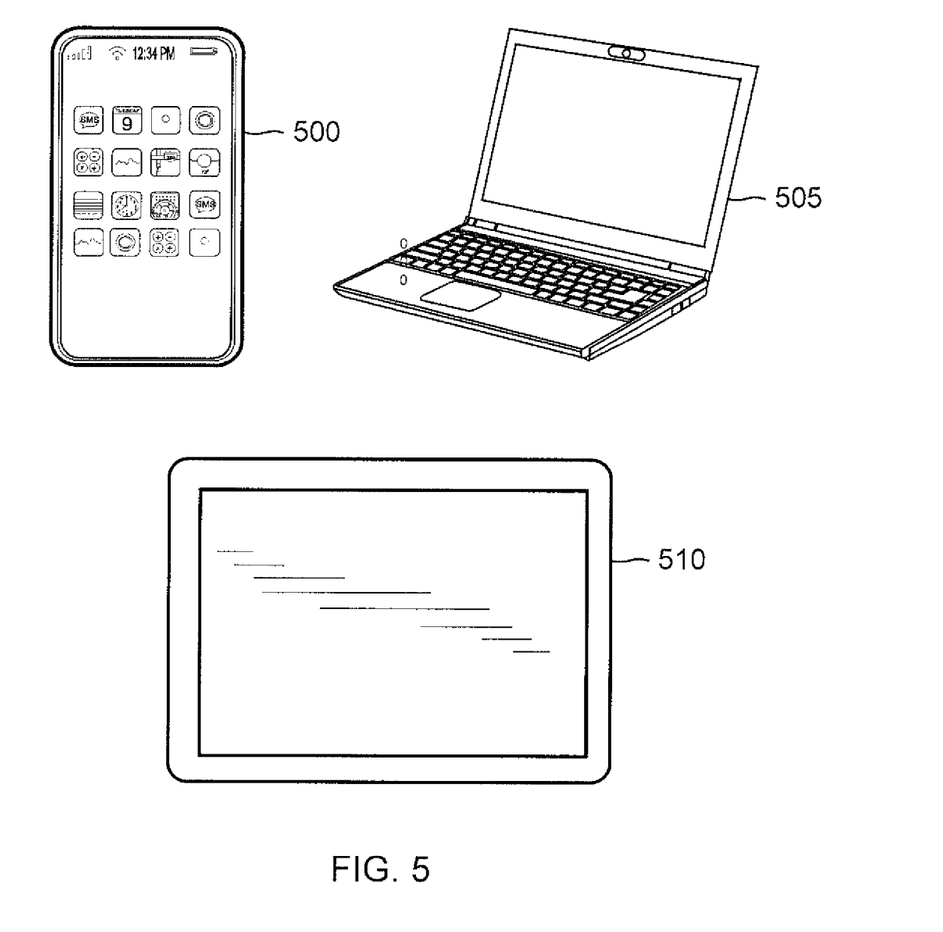
FIG. 5 illustrates some example electronic systems incorporating a bottom package in accordance with an embodiment of the disclosure.

Integrated circuit packages including a bottom package with metal posts as disclosed herein may be incorporated into a wide variety of electronic systems. For example, as shown in FIG. 5, a cell phone 500, a laptop 505, and a tablet PC 510 may all include an integrated circuit package incorporating a metal-post-containing bottom package constructed in accordance with the disclosure. Other exemplary electronic systems such as a music player, a video player, a communication device, and a personal computer may also be configured with integrated circuit packages constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A package, comprising:
   a substrate;
   a die-side redistribution layer on the substrate;
   a dielectric layer on the die-side redistribution layer, wherein the dielectric layer comprises a plurality of openings;
   a seed layer on the dielectric layer;
   a plurality of die interconnects electrically coupled to the die-side redistribution layer through the seed layer via at least some of the plurality of openings in the dielectric layer; and
   a plurality of plated metal posts electrically coupled to the die-side redistribution layer through the seed layer via at least some of the plurality of openings in the dielectric layer, wherein the plurality of metal posts are in situ on the substrate,
   wherein the substrate comprises a glass interposer or a semiconductor interposer.

2. The package of claim 1, further comprising at least one die electrically coupled to at least a subset of the plurality of die interconnects.

3. The package of claim 2, wherein the substrate comprises a glass interposer, and wherein the at least one die comprises a plurality of dies, each die being electrically coupled to a corresponding subset of the die interconnects.

4. The package of claim 3, further comprising a mold compound at least partially encapsulating the plurality of dies, and wherein both the die interconnects and the plated metal posts comprise a metal selected from the group consisting of copper and nickel.

5. The package of claim 2, further comprising a top package electrically coupled to the plurality of plated metal posts through an upper die-side redistribution layer electrically coupled a lower die-side redistribution layer.

6. The package of claim 1, wherein the die interconnects comprise a plurality of solder bumps.

7. The package of claim 1, wherein the die interconnects comprise a plurality of solder pillars.

8. The package of claim 1, further comprising:
   a plurality of through-substrate vias extending through the substrate;
   a board-facing redistribution layer adjacent a board-facing surface of the substrate, wherein at least a subset of the through-substrate vias electrically couple a die-facing redistribution layer to the board-facing redistribution layer.

9. The package of claim 8, further comprising a plurality of solder balls adjacent the board-facing surface of the substrate, wherein the plurality of solder balls are electrically coupled to the board-facing redistribution layer.

10. The package of claim 8, wherein the die-facing redistribution layer and the board-facing redistribution layer each comprises a patterned copper metal layer.

11. A package, comprising:
    a plurality of die;
    an interposer configured to support at least one of the plurality of die;
    a die-side redistribution layer on the interposer;
    a dielectric layer on the die-side redistribution layer, wherein the dielectric layer comprises a plurality of openings;
    a seed layer on the dielectric layer;
    means for electrically coupling the plurality of die to the die-side redistribution layer through the seed layer; and
    a plurality of plated metal posts electrically coupled to the die-side redistribution layer through the seed layer via at least some of the plurality of openings in the dielectric layer, wherein the plurality of plated metal posts are in situ on the interposer,
    wherein the interposer comprises a glass interposer or a semiconductor interposer.

12. The package of claim 11, further comprising a plurality of through substrate vias extending through the interposer, wherein the plurality of through-substrate vias are electrically coupled to the die-side redistribution layer.

13. The package of claim 11, wherein the package is incorporated into at least one of a cellphone, a laptop, a tablet, a music player, a communication device, a computer, and a video player.

14. The package of claim 11, wherein the plated metal posts comprise plated copper metal posts.

* * * * *